(12) United States Patent
Hönlein et al.

(10) Patent No.: US 7,301,779 B2
(45) Date of Patent: Nov. 27, 2007

(54) ELECTRONIC CHIP AND ELECTRONIC CHIP ASSEMBLY

(75) Inventors: Wolfgang Hönlein, Unterhaching (DE); Helmut Klose, deceased, late of München (DE); by Hyang-Sook Klose, legal representative, Augsburg (DE); Franz Kreupl, München (DE); Werner Simbürger, Haar (DE)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 10/479,735

(22) PCT Filed: Jun. 3, 2002

(86) PCT No.: PCT/DE02/02026

§ 371 (c)(1),
(2), (4) Date: Jun. 22, 2004

(87) PCT Pub. No.: WO02/099845

PCT Pub. Date: Dec. 12, 2002

(65) Prior Publication Data

US 2004/0233649 A1 Nov. 25, 2004

(30) Foreign Application Priority Data

Jun. 6, 2001 (DE) .................. 101 27 351

(51) Int. Cl.
*H01R 11/01* (2006.01)

(52) U.S. Cl. .................. 361/772; 361/777; 361/779; 257/734; 257/776

(58) Field of Classification Search .............. 361/760, 361/772, 773, 776, 777, 778, 779; 257/734, 257/735, 777; 324/754, 757
See application file for complete search history.

(56) References Cited

U.S. PATENT DOCUMENTS

| | | | | |
|---|---|---|---|---|
| 5,457,343 | A * | 10/1995 | Ajayan et al. | 257/734 |
| 5,805,424 | A * | 9/1998 | Purinton | 361/760 |
| 5,805,426 | A * | 9/1998 | Merritt et al. | 361/769 |
| 5,818,700 | A * | 10/1998 | Purinton | 361/760 |
| 6,020,747 | A | 2/2000 | Bahns et al. | |
| 6,052,286 | A * | 4/2000 | Worthen et al. | 361/765 |
| 6,183,714 | B1 * | 2/2001 | Smalley et al. | 423/447.3 |
| 6,297,063 | B1 * | 10/2001 | Brown et al. | 438/2 |
| 6,322,713 | B1 * | 11/2001 | Choi et al. | 216/38 |
| 6,340,822 | B1 | 1/2002 | Brown et al. | |
| 6,429,029 | B1 * | 8/2002 | Eldridge et al. | 438/14 |
| 6,796,897 | B1 * | 9/2004 | Lovett et al. | 460/99 |
| 6,882,051 | B2 * | 4/2005 | Majumdar et al. | 257/746 |
| 6,989,325 | B2 * | 1/2006 | Uang et al. | 438/613 |
| 2004/0152240 | A1 * | 8/2004 | Dangelo | 438/122 |

FOREIGN PATENT DOCUMENTS

| | | |
|---|---|---|
| EP | 0 614 089 A2 | 9/1994 |
| EP | 0 918 354 A2 | 5/1999 |

(Continued)

*Primary Examiner*—Dean A. Reichard
*Assistant Examiner*—Dameon E. Levi
(74) *Attorney, Agent, or Firm*—Dicke, Billig & Czaja, PLLC

(57) ABSTRACT

A multiplicity of nanotubes are applied to at least one external chip metal contact of an electronic chip in order to make contact between the electronic chip and a further electronic chip.

9 Claims, 3 Drawing Sheets

FOREIGN PATENT DOCUMENTS

| | | |
|---|---|---|
| EP | 1 069 206 A2 | 1/2001 |
| EP | 1 087 413 A2 | 3/2001 |
| EP | 1 096 533 A2 | 5/2001 |
| EP | 1 100 297 A2 | 5/2001 |
| JP | 11-139815 | 5/1999 |
| JP | 2002141633 | 5/2002 |

* cited by examiner

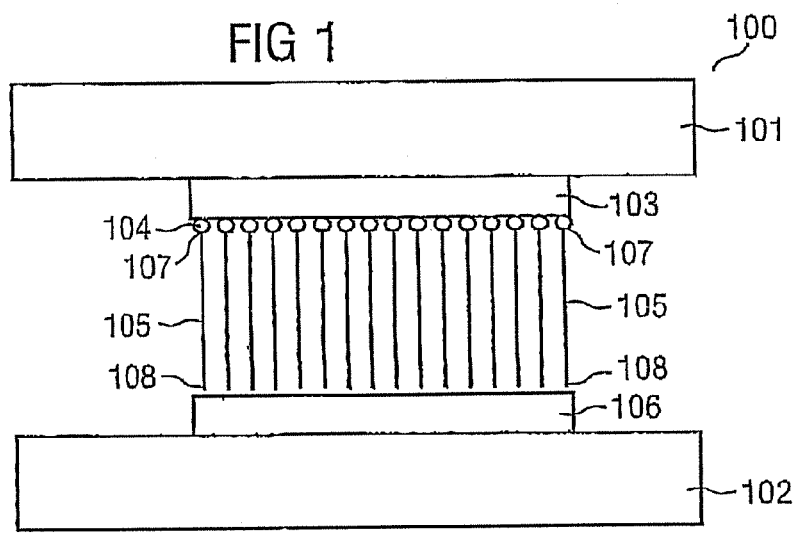
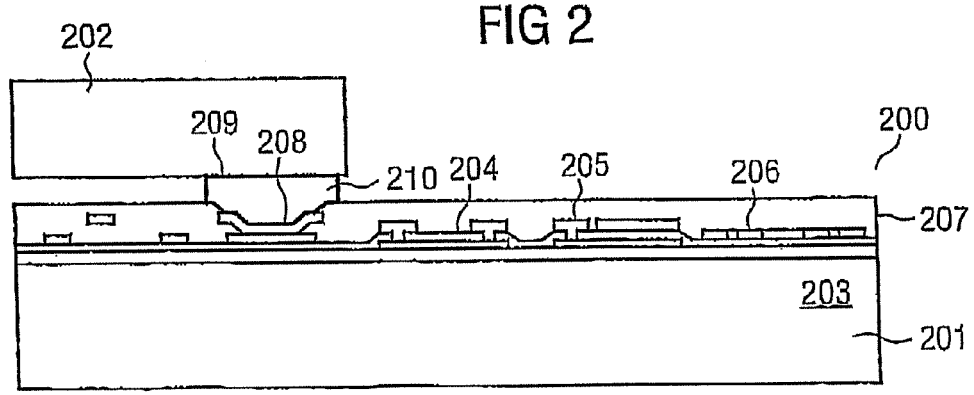

ELECTRONIC CHIP AND ELECTRONIC CHIP ASSEMBLY

CROSS REFERENCE TO RELATED APPLICATION(S)

This Utility Patent Application claims the benefit of the filing date of Application No. DE 101 27 351.7, filed Jun. 6, 2001 and International Application No. PCT/DE02/02026, filed Jun. 3, 2002, both of which are herein incorporated by reference.

The invention relates to an electronic chip and to an electronic chip assembly.

To make mechanical and electrical contact between two fully processed electronic chips or between one processed chip and a peripheral unit, it is known for the vertical connection between two electronic chips to be made by means of in each case one external chip metal contact of the two electronic chips which are to be brought into contact with one another and by means of a soldered joint.

FIG. 2 shows a known chip assembly 200 of this type.

The chip assembly 200 has a first electronic chip 201 and a second electronic chip 202, and the first chip 201 and the second chip 202 are to be brought into electrical contact with one another.

In a layer sequence which is applied to a substrate 203, the first chip 201 has a plurality of electrical components, namely an electrical resistor 204, a capacitor 205 and an inductor 206, which are integrated in the first electronic chip 201 as electric circuit 207.

Furthermore, the first chip has a first external chip metal contact 208, by means of which the first electronic chip 201 is electronically coupled to the second electronic chip 202.

The second chip 202 likewise has an electric circuit (not shown), which is integrated in the second chip 202. Furthermore, the second chip 202 includes a second external chip metal contact 209, which is used to make electrical contact with the first electronic chip metal contact 208 of the first electronic chip 201.

To electronically couple the two chip metal contacts 208, 209 solder material 210, usually an electrically conductive metal connection, is introduced between the two external chip metal contacts 208, 209. The two external chip metal contacts 208, 209 are coupled by means of the solder material 210, preferably as a result of the chip metal contacts 208, 209 being soldered using the solder material 210.

Various processes are known for making contact between two fully processed electronic chips, such as for example the Ball Grid Array process (BGA), the Flip-Chip process (FC), the Chip Scale Packaging process (FSC), the Plastic Dual In-line Packages process (PDIP), the Quad Flat Packs process (QFP) or the Small-Outline ICs process (SOICs).

A common feature of these processes is that, to make contact, the external chip metal contacts are soldered to one another or are brought into contact by means of bonding wires or at least by means of metal connections.

If an electronic chip is designed as a test chip for testing correct operation of a multiplicity of further chips, it is necessary to couple an external chip metal contact of the test chip to one test connection of the electronic chip which is to be tested in each case. The one test connection also has a chip metal contact. This usually takes place using what are known as needle cards, i.e., by means of metal contacts in needle form.

The known coupling of two electronic chips using metal layers or bonding wires, generally using metal elements, has a number of drawbacks.

Particularly in the case of a high-frequency application, the limited current-carrying capacity of the bonding material is disadvantageous, since it leads to very considerable heating and a not insignificant electronic resistance on the part of the chip coupling.

Furthermore a considerable mechanical load means that cracks and general damage in the metal connection may occur in the coupling itself, which can lead to a deterioration in the electronic contact or even to electronic contact no longer existing.

Furthermore, European Patent EP 1,087,413 A2 has disclosed a tactile sensor, in which in each case a multiplicity of nanowires are grown on a plurality of contact elements. An element which is to be recorded by means of the sensor is recorded as a result of the nanowires being mechanically bent by the element, so that the nanowires of adjacent contact elements of the sensor touch one another and thereby an electrical short circuit is formed.

U.S. Pat. No. 5,805,426 describes a microelectronic device in which a nanoporous layer is introduced between two electrically conductive contact-making elements, the pores being filled with metal, so that the contacting elements are electrically coupled by means of the metal-filled pores.

European Patent EP 1,096,533 A1 describes a process for producing carbon nanotubes.

U.S. Pat. No. 6,020,747 discloses a further electrical measurement sensor.

U.S. Pat. No. 6,340,822 B1, which was only published after the priority date of the invention, describes a device with at least two circuit layers which are electrically coupled to one another in the vertical direction by means of carbon nanotubes.

Therefore, the invention is based on the problem of coupling an electronic chip to another chip in an electronically conductive manner via an external electronic chip contact, in which arrangement the coupling is less susceptible to faults.

The problem is solved by the electronic chip and by the electronic chip assembly having the features described in the independent patent claims.

An electronic chip has a plurality of external chip contacts, and in one embodiment a plurality of chip metal contacts, to each of which a multiplicity of nanotubes are applied in order to make contact between the electronic chip and another electronic chip.

The other electronic chip likewise has a plurality of external chip contacts, and in one embodiment a plurality of chip metal contacts. The multiplicity of nanotubes of one external chip contact are to be brought into contact with a corresponding, obviously associated, external chip contact of the other electronic chip. In this context, it should be noted that the nanotubes of different chip contacts, for example chip contacts which adjoin one another, must not touch one another, since otherwise undesired short circuits could occur. The nanotubes of one chip contact are only ever coupled to the desired, corresponding chip contact of the other electronic chip, and consequently, electronic contact can only be made between the desired external chip contacts.

According to one embodiment of the invention, an electronic chip is to be understood as meaning an electronic chip which has been fully processed in the customary way.

In this context, an external chip contact is to be understood as meaning an electronic contact of the chip which remains after completion of the chip, for chip-external driving, i.e., driving or signal exchange by an element located in the vicinity of the chip, for example, using a further chip.

In this context, an external chip contact is to be understood as meaning an electronic contact of the chip which remains after completion of the chip, for chip-external driving, i.e. driving or signal exchange by an element located in the vicinity of the chip, for example using a further chip.

An electronic chip assembly has a first electronic chip and a second electronic chip. The first electronic chip has a plurality of external chip contacts, to which a multiplicity of nanotubes are applied in order to make contact between the electronic first chip and the second electronic chip. The second electronic chip likewise has a plurality of external chip contacts, which can be brought into electrical and mechanical contact with the nanotubes that have been applied to the first chip contact of the first electronic chip. The nanotubes of one external chip contact of the first electronic chip are brought into contact with one external chip contact of the second external chip contact.

One embodiment of the invention can be considered to reside in the fact that nanotubes, preferably carbon nanotubes, are used to electrically connect two fully processed electronic chips to one another via external chip contacts.

Compared to the use of solder material for connecting two electronic chips, the inventive use of nanotubes has the advantage in particular that the nanotubes used are flexible and that therefore a more stable coupling both with regard to mechanical stability and with regard to the reliability of the electronic coupling between the external chip contacts is achieved. This is attributable in particular to the fact that the modulus of elasticity is approximately one TPa.

Furthermore, in this context, the robustness of the nanotubes which are used should be pointed out, which leads to a considerably improved stability of the coupling between the external chip contacts of the electronic chips which are to be brought into contact with one another.

A further advantage of the coupling according to the invention between the electronic chips is to be considered to reside in the fact that the nanotubes are chemically inert.

It is customary to use carbon nanotubes, the current-carrying capacity in particular of the electrically conductive carbon nanotubes being greater by up to a factor of 1000 than, for example, the current-carrying capacity of copper, as a metal which is customarily used for the connection between two electronic chips.

A further advantage is to be considered to reside in the thermal conductivity of the nanotubes, which is approximately 6000 Watts/mK, whereas the thermal conductivity of copper is approximately 400 Watts/mK.

Furthermore, it should be noted that in the case of a fixed metal connection between the electronic chips, the different coefficients of thermal expansion often lead to considerable mechanical stresses in the solder material which, under recurring varying thermal loads, can lead to destruction of the component or of the external chip contacts and/or of the metal coupling.

This problem is particularly important in high-frequency applications, i.e. in high-frequency chips, since they usually have a particularly high current consumption during operation, which leads to considerable heating of the electronic chips.

The use of nanotubes, in particular of carbon nanotubes, reduces the problem described above in two respects. Firstly, the high thermal conductivity of the nanotubes means that the heat is rapidly dissipated to the environment, and secondly shear forces which occur in the coupling can be reduced via the nanotubes, which can easily move in the lateral direction yet are nevertheless inherently stable, without the nanotubes themselves being destroyed.

Preferred refinements of the invention will emerge from the dependent claims.

The nanotubes may be designed as carbon nanotubes, and in this context in particular as electrically conductive or electrically semiconducting carbon nanotubes. The chip contact, which preferably consists of metal and is therefore also referred to below as a chip metal contact, may comprise a layer sequence in particular comprising two layers, namely a chip metal contact layer and a catalyst layer which is applied thereto. The catalyst layer includes material which has a catalytic action with regard to the growth of nanotubes, preferably with regard to the growth of carbon nanotubes. In this context, a catalyst layer is also to be understood as meaning a collection of individual clusters of the respective catalyst material, in other words, the catalyst layer does not necessarily have to comprise a continuous layer of catalyst material.

In this context, it should be noted that the chip metal contact layer itself may also consist of a metal which has a catalytic effect with regard to the growth of the nanotubes.

The use of catalyst material considerably simplifies and accelerates the growth of the nanotubes.

The chip metal contact, in particular the chip metal contact layer, may be produced from any desired metal, preferably from aluminium and/or copper, or from any desired metal alloy, preferably from a metal alloy of the two metals mentioned above.

Nickel, cobalt or iron or a mixture of the above materials can be used as catalyst material.

According to an embodiment of the invention, it is provided that the nanotubes are soldered to the external chip metal contact in order to further strengthen the mechanical contact, i.e., the mechanical coupling, between the external chip contact and one end of a respective nanotube, so that the mechanical stability of the chip connection is further increased.

Alternatively, the mechanical coupling between an external chip contact and one end of a respective nanotube can be produced by means of an electrochemical coupling.

According to one configuration of the invention, the electronic chip is designed as a test chip, i.e., as a chip that can be used to test a predetermined function of further electronic chips. In this case, the nanotubes serve as a replacement for the standard needle card used to make contact with the chip that is to be tested in each case.

The test chip may have an integrated test circuit, which further increases the reliability of the processed electrical signals.

If the first electronic chip is not designed as a test chip and the electronic chip assembly has two electronic chips which are to be brought into permanent contact with one another, the nanotubes may be soldered to the metal of the respective external chip elements at both ends, with the result that the mechanical and therefore also electronic stability is increased further.

In general terms, the invention can be applied to any desired number of electronic chips which are to be brought into contact with one another.

The invention is suitable in particular for use in an HF application, i.e. for high-frequency components or in a high-frequency chip.

Exemplary embodiments of the invention are illustrated in the figures and explained in more detail below.

BRIEF DESCRIPTION OF THE DRAWINGS

FIG. 1 shows an electronic chip assembly in accordance with a first exemplary embodiment of the invention at a first time during the production process;

FIG. 2 shows an electronic chip assembly in accordance with the prior art;

FIG. 1 shows a chip assembly 100 in accordance with a first exemplary embodiment of the invention at a first time during its production.

Figure 3:
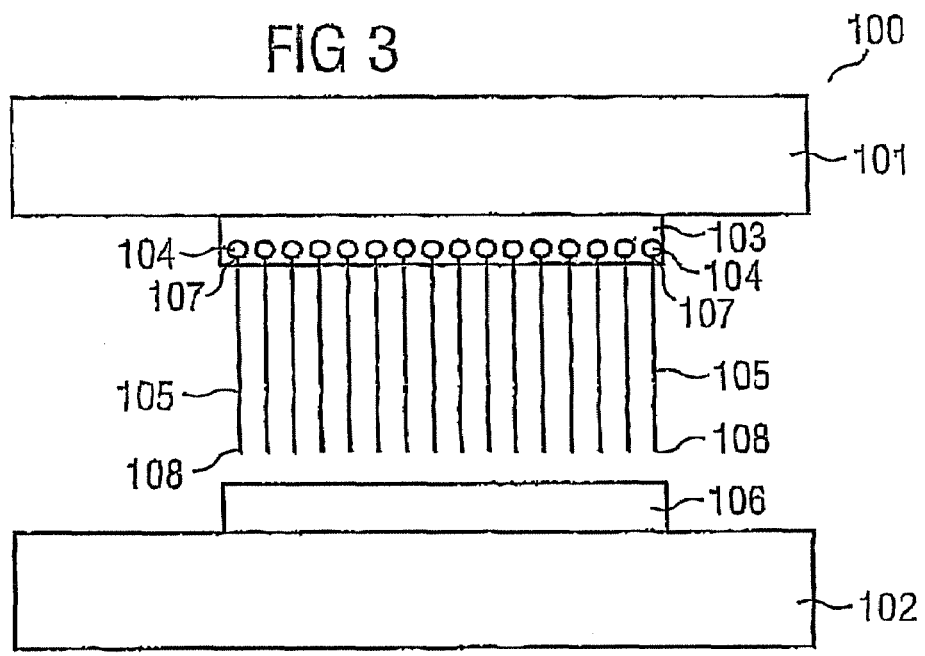
FIG. 3 shows an electronic chip assembly in accordance with the first exemplary embodiment of the invention at a second time during the production process.

The chip assembly 100 has a first electronic chip 101 and a second electronic chip 102, which are to be brought into a mechanical and electronic contact with one another.

The first electronic chip 101 and the second electronic chip 102 each have an integrated electronic circuit, which are not illustrated in order to simplify explanation of the invention.

A catalyst layer 104 comprising iron is applied to the first electronic chip 101 on a contact pad, i.e. on an external chip metal contact 103 comprising aluminum by means of a lift-off process. According to one exemplary embodiment, the catalyst layer 104 comprises a plurality of metal particles, in particular metal clusters comprising iron, which are arranged next to one another.

Alternatively, instead of the catalyst being applied at a later stage, the external chip metal contact 103 may be applied directly, together with the catalyst material, to the inherently fully processed electronic chip 101.

The catalyst layer 104 has a thickness of approximately 5 nm to 10 nm.

Then, carbon nanotubes 105 are grown on up to a desired heights. According to one exemplary embodiment, carbon nanotubes 105 are grown up to a height of approximately 100 μm to 500 μm, using a CVD process or a plasma-enhanced CVD (PECVD) process, and using acetylene ($C_2H_2$) at a temperature of 600° C. and a pressure of 10 torr for a period of 30 minutes.

According to the one exemplary embodiment, the external chip metal contact 103 is rectangular in shape, with side lengths of in each case 50 μm to 100 μm.

In a further step, the carbon nanotubes 105 and therefore the chip metal contact 103 of the first electronic chip 101 are moved into the same local position as, and into mechanical contact with, a chip metal contact 106 of the second electronic chip 102, i.e., the carbon nanotubes 105 are aligned with the chip metal contact 106 of the second electronic chip 102.

Then, the carbon nanotubes 105 are embedded in the aluminum of the metal contact layer 103, i.e., of the external chip contact 103 as a result of the chip assembly 100 being heated in a hydrogen environment at over 660° C. and then cooled again by means of a rapid thermal processing process.

In this way, the carbon nanotubes 105, at a respective first end 107, are fixedly joined to the aluminum of the external chip metal contact 103 of the first electronic chip 101, i.e. are secured in the aluminum, and then the first electronic chip 101 is aligned above the desired contact surface, i.e., the chip metal contact 106 of the second electronic chip 102. Chip assembly 100 is then heated again in a hydrogen atmosphere at a temperature of over 660° C. and cooled again by means of a rapid thermal processing process, so that the respective second ends 108 are fixedly joined to the aluminum of the external chip metal contact 106 of the second electronic chip 102, i.e., are secured in the aluminum.

The respective ends 107, 108 of the carbon nanotubes 105 are evidently soldered to the external chip metal contacts 103, 106 by means of the rapid thermal processing process.

FIG. 3 shows the state of the chip assembly 100 after soldering of the first ends 107 of the carbon nanotubes 105 to the chip metal contact 103 of the first electronic chip 101 has taken place, using identical reference numerals for identical components.

In other words, the soldering takes place as a result of the chip assembly 100, after the carbon nanotubes 105 have been grown on, being heated to above the eutectic temperature of the material of the chip metal contacts 103, 106 for a short time, to embed the carbon nanotubes 105 in the material of the chip metal contacts 103, 106. This takes place in the same way for the embedding of the further ends 108 of the carbon nanotubes 105 in the chip metal contacts 106 of the second electronic chip 102.

Aluminum or any other desired metal or metal mixture. Example, Pb40Sn60, Pb95Sn5 or any other desired eutectic mixture can be used as material for embedding the ends 107, 108 of the carbon nanotubes 105 in the chip metal contacts 103, 106 in order to make contact with the carbon nanotubes 105.

Figure 4:
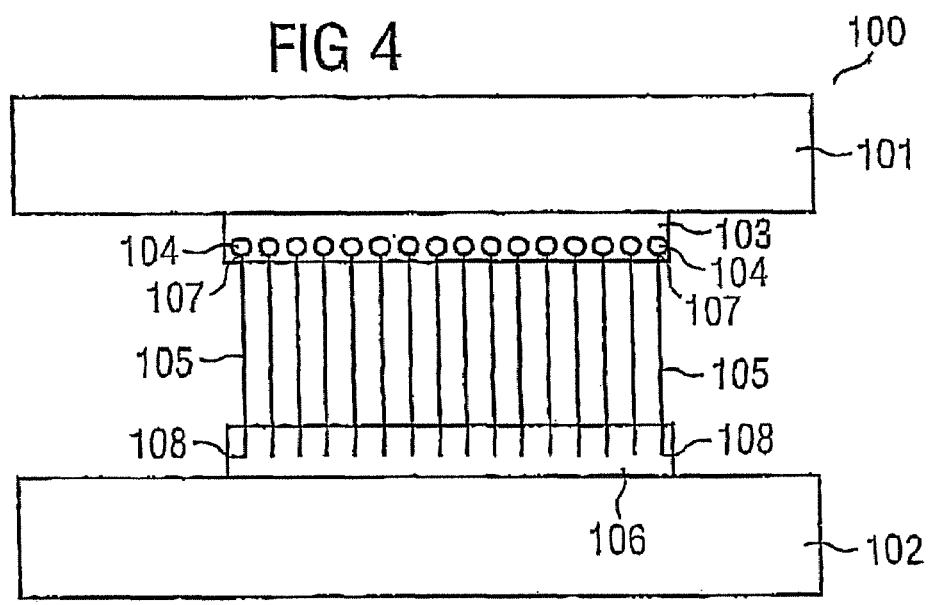
FIG. 4 shows an electronic chip assembly in accordance with the first exemplary embodiment of the invention at a third time during the production process.

FIG. 4 shows the chip assembly 100 in the state in which the second ends 108 of the carbon nanotubes 105 are already embedded in, i.e., soldered to, the external chip metal contact 106 of the second electronic chip 102.

In this context, it should be noted that the two soldering steps may also be combined to form a joint rapid thermal processing step, i.e., to form one soldering step.

Figure 5:
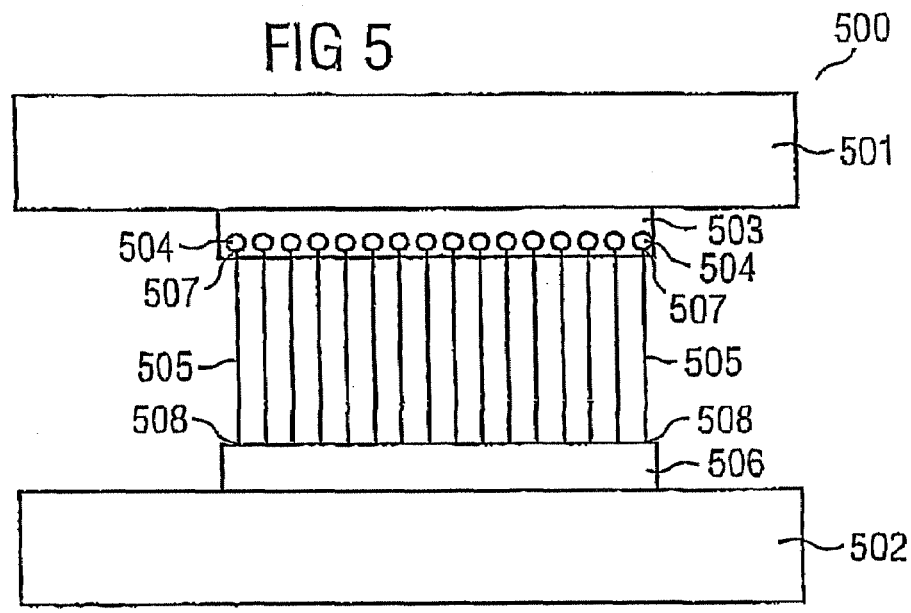
FIG. 5 shows an electronic chip assembly in accordance with a second exemplary embodiment of the invention.

FIG. 5 shows an electronic chip assembly 500 in accordance with a second exemplary embodiment of the invention.

In accordance with the second exemplary embodiment, a first electronic chip 501 is designed as a test chip 501 and is used to test further electronic chips which are to be tested, illustrated in this exemplary embodiment on the basis of a chip 502 which is to be tested.

The test chip 501 has a test circuit (not shown) integrated in it and has at least one external chip metal contact 503. In principle, any desired number of chip metal contacts 503 which have been soldered to the first ends 507 of carbon nanotubes 505 and have been grown on the catalyst layer 504 may be integrated in accordance with the process described above. The test circuit which is integrated in the test chip 501 is designed in such a manner that it can be used to check a predetermined desired function of the electronic chip 502, which is to be tested.

According to one exemplary embodiment, the second ends 508 are not fixedly soldered to the external chip metal contact 506 of the electronic chip 502 which is to be tested, but rather, for test purposes, are merely brought into mechanical and therefore electrical contact with the external chip contact 506 of the chip 502 which is to be tested, in order in this way for the test routine for testing the electronic chip 502 which is to be tested to be carried out.

Figure 6:
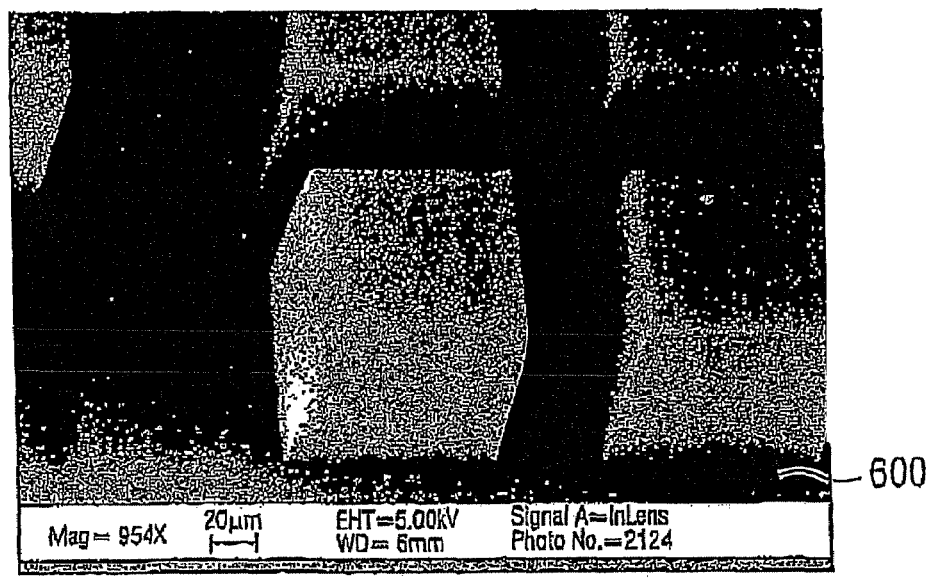
FIG. 6 shows a scanning electron microscope image of a plan view of an electronic chip according to the invention, in which carbon nanotubes have been grown on external chip contacts.

FIG. 6 shows a scanning electron microscope image of a plan view of an electronic chip 600 with a plurality of square external chip metal contacts and carbon nanotubes which have been applied thereto and evidently form a cluster lawn of carbon nanotubes on the respective chip metal contact.

The invention claimed is:

1. An electronic chip assembly comprising:
a first electronic chip;
a second electronic chip;
the first electronic chip having a plurality of external chip contacts to which a multiplicity of nanotubes are applied in order to make contact between the first electronic chip and the second electronic chip;
the second electronic chip having a plurality of external chip contacts that are free of nanotubes and that can be brought into contact with the nanotubes that have been applied to the external chip contacts of the first electronic chip; and
wherein the nanotubes of one external chip contact of the first electronic chip are brought into contact with one external chip contact of the second electronic chip.

2. The electronic chip assembly according to claim 1, wherein the multiplicity of nanotubes are a multiplicity of carbon nanotubes.

3. The electronic chip assembly according to claim 1, wherein the external chip contact of the first electronic chip has a chip contact layer and a catalyst layer applied thereto and wherein the material of the catalyst layer has a catalytic action with regard to the growth of the nanotubes.

4. The electronic chip assembly according to claim 1,wherein the external chip contacts of the first electronic chip and the chip contact of the second electronic chip includes at least one metal from the group aluminum and copper.

5. The electronic chip assembly according to claim 3, wherein the catalyst layer includes at least one metal from the group nickel, cobalt, and iron.

6. The electronic chip assembly according to claim 1, wherein the nanotubes are soldered to the external chip contacts of the first electronic chip or to the chip contact of the second electronic chip.

7. The electronic chip assembly according to claim 1, wherein the nanotubes are electrochemically coupled to the external chip contacts of the first electronic chip or to the chip contact of the second electronic chip.

8. The electronic chip assembly according to claim 1, wherein the first electronic chip is designed as a test chip.

9. The electronic chip assembly according to claim 8, wherein the test chip has an integrated test circuit.

* * * * *

UNITED STATES PATENT AND TRADEMARK OFFICE
CERTIFICATE OF CORRECTION

PATENT NO. : 7,301,779 B2
APPLICATION NO. : 10/479735
DATED : November 27, 2007
INVENTOR(S) : Wolfgang Hönlein et al.

It is certified that error appears in the above-identified patent and that said Letters Patent is hereby corrected as shown below:

Column 1, line 49, delete "Ball Grid Array" and insert in place thereof --Ball Grid Array--.

Column 1, line 49, delete "Flip-Chip" and insert in place thereof --Flip-Chip--.

Column 1, line 50, delete "Chip Scale Packaging" and insert in place thereof --Chip Scale Packaging--.

Column 1, lines 50-51, delete "Plastic Dual In-line Packages" and insert in place thereof -- Plastic Dual In-line Packages--.

Column 1, line 51, delete "Quad Flat Packs" and insert in place thereof --Quad Flat Packs--.

Column 1, line 52, delete "Small Outline ICs" and insert in place thereof --Small Outline ICs--.

Column 3, line 4, delete "i.e." and insert in place thereof --i.e.,--.

Column 3, line 5, delete "example" and insert in place thereof --example,--.

Column 3, line 13, delete "contacts," and insert in place thereof --contacts--.

Column 3, line 58, delete "i.e." and insert in place thereof --i.e.,--.

Column 4, line 64, delete "i.e." and insert in place thereof --i.e.,--.

Column 5, line 31, delete "i.e." and insert in place thereof --i.e.,--.

Column 5, line 44, delete "heights" and insert in place thereof --height--.

Column 5, line 47, delete "process," and insert in place thereof --process--.

Column 5, line 50, delete "to the one" and insert in place thereof --to one--.

Column 6, line 1, delete "i.e." and insert in place thereof --i.e.,--.

UNITED STATES PATENT AND TRADEMARK OFFICE
CERTIFICATE OF CORRECTION

PATENT NO.       : 7,301,779 B2
APPLICATION NO.  : 10/479735
DATED            : November 27, 2007
INVENTOR(S)      : Wolfgang Hönlein et al.

It is certified that error appears in the above-identified patent and that said Letters Patent is hereby corrected as shown below:

Column 7, line 6, delete "The invention claimed is:" and insert in place thereof --IN THE CLAIMS:--.

Column 7, line 22, delete "claim" and insert in place thereof --Claim--.

Column 7, line 25, delete "claim" and insert in place thereof --Claim--.

Column 8, line 4, delete "claim" and insert in place thereof --Claim--.

Column 8, line 5, delete "1,wherein" and insert in place thereof --1, wherein--.

Column 8, line 9, delete "claim" and insert in place thereof --Claim--.

Column 8, line 12, delete "claim" and insert in place thereof --Claim--.

Column 8, line 16, delete "claim" and insert in place thereof --Claim--.

Column 8, line 20, delete "claim" and insert in place thereof --Claim--.

Column 8, line 22, delete "claim" and insert in place thereof --Claim--.

Signed and Sealed this

Ninth Day of September, 2008

JON W. DUDAS
*Director of the United States Patent and Trademark Office*